(12) United States Patent
Shtein et al.

(10) Patent No.: US 7,722,927 B2
(45) Date of Patent: May 25, 2010

(54) DEVICE AND METHOD FOR ORGANIC VAPOR JET DEPOSITION

(75) Inventors: Max Shtein, Princeton, NJ (US); Stephen R. Forrest, Ann Arbor, MI (US); Jay B. Benzinger, Lawrenceville, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 12/175,641

(22) Filed: Jul. 18, 2008

(65) Prior Publication Data
US 2008/0311296 A1    Dec. 18, 2008

Related U.S. Application Data

(60) Division of application No. 10/422,269, filed on Apr. 23, 2003, now Pat. No. 7,404,862, which is a continuation-in-part of application No. 10/233,470, filed on Sep. 4, 2002, now Pat. No. 7,431,968.

(60) Provisional application No. 60/317,215, filed on Sep. 4, 2001, provisional application No. 60/316,264, filed on Sep. 4, 2001, provisional application No. 60/316,968, filed on Sep. 5, 2001, provisional application No. 60/332,090, filed on Nov. 21, 2001.

(51) Int. Cl.
*C23C 16/00*    (2006.01)

(52) U.S. Cl. .............. 427/255.6; 427/255.23; 427/248.1

(58) Field of Classification Search ........... None
See application file for complete search history.

(56) References Cited

U.S. PATENT DOCUMENTS

| 3,930,908 A | 1/1976 | Jolly |
| 4,788,082 A | 11/1988 | Schmitt |

(Continued)

FOREIGN PATENT DOCUMENTS

EP    173 715    4/1992

(Continued)

OTHER PUBLICATIONS

Baldo et al. Organic Vapor Phase deposition, Adv. Mater. 1998 10 No. 18.*

(Continued)

*Primary Examiner*—Timothy Meeks
*Assistant Examiner*—Kelly M Gambetta
(74) *Attorney, Agent, or Firm*—Townsend and Townsend and Crew LLP

(57) ABSTRACT

A device and a method for facilitating the deposition and patterning of organic materials onto substrates utilizing the vapor transport mechanisms of organic vapor phase deposition is provided. The device includes one or more nozzles, and an apparatus integrally connected to the one or more nozzles, wherein the apparatus includes one or more source cells, a carrier gas inlet, a carrier gas outlet, and a first valve capable of controlling the flow of a carrier gas through the one or more source cells. The method includes moving a substrate relative to an apparatus, and controlling the composition of the organic material and/or the rate of the organic material ejected by the one or more nozzles while moving the substrate relative to the apparatus, such that a patterned organic layer is deposited over the substrate.

48 Claims, 10 Drawing Sheets

U.S. PATENT DOCUMENTS

| | | | |
|---|---|---|---|
| 5,256,205 | A | 10/1993 | Schmitt, III et al. |
| 5,356,673 | A | 10/1994 | Schmitt et al. |
| 5,421,888 | A | 6/1995 | Hasegawa |
| 5,554,220 | A | 9/1996 | Forrest et al. |
| 5,595,606 | A | 1/1997 | Fujikawa et al. |
| 5,650,197 | A | 7/1997 | Halpern |
| 5,707,745 | A | 1/1998 | Forrest et al. |
| 5,720,821 | A | 2/1998 | Halpern |
| 5,759,634 | A | 6/1998 | Zang |
| 6,037,241 | A | 3/2000 | Powell et al. |
| 6,048,630 | A | 4/2000 | Burrows et al. |
| 6,056,823 | A | 5/2000 | Sajoto et al. |
| 6,065,492 | A | 5/2000 | Bergamini |
| 6,066,357 | A * | 5/2000 | Tang et al. .................. 427/66 |
| 6,165,554 | A * | 12/2000 | Halpern et al. ........... 427/248.1 |
| 6,337,102 | B1 | 1/2002 | Forrest et al. |
| 6,482,266 | B1 | 11/2002 | Matsumoto et al. |
| 6,537,607 | B1 | 3/2003 | Swanson |
| 6,572,706 | B1 | 6/2003 | Nguyen et al. |
| 6,716,656 | B2 | 4/2004 | Shtein et al. |
| 6,962,624 | B2 | 11/2005 | Jurgenesen et al. |
| 2003/0054099 | A1 | 3/2003 | Jurgensen et al. |
| 2003/0054100 | A1 | 3/2003 | Eser et al. |
| 2003/0087471 | A1 | 5/2003 | Shtein et al. |

FOREIGN PATENT DOCUMENTS

| | | |
|---|---|---|
| GB | 2 336 553 | 10/1999 |
| JP | 6-027329 | 4/1994 |
| JP | 7-258828 | 10/1995 |
| WO | WO 85/03460 | 8/1985 |
| WO | WO 99/25894 | 5/1999 |
| WO | WO 01/61071 | 8/2001 |
| WO | WO 02/27064 | 4/2002 |

OTHER PUBLICATIONS

Zhang et al., Jet Vapor Deposition of Nanostructure Composite Materials, Materials Res. Soc. Symp. Proc., Mater. Res. Soc. Symposium Proc. 1193, 286, pp. 385-389.

Supplementary European Search Report from EP 0 277 0461 dated Jun. 12, 2007.

Forrest et al., "Intense Second Harmonic and Long-Range Structural Ordering in Thin Films of Organic Salt Grown by Organic Vapor Phase Deposition," Appl. Phys. Lett., vol. 68, pp. 1326-1328 (1996).

Shtein et al., "Effects of Film Morphology and Gate Dielectric Surface Preparation on the Electrical Characteristics of Organic Vapor Phase Deposited Pentacene Thin-Film Transistors," Appl. Phys. Lett., vol. 81, pp. 268-270 (2002).

Shtein, et al., "Micron scale patterning of organic thin films via organic vapor phase deposition", Presentation Outline from the Mat. Res. Soc. Ann. Meeting 2001, Boston.

Shtein et al., "Micropatterning of small molecular weight organic semiconductor thin films using organic vapor phase deposition", J. Appl. Phys., vol. 93, No. 7, pp. 4005-4016, Apr. 1, 2003.

S. Krumdieck, "Kinetic Model of Low Pressure Film Deposition from Single Precursor Vapor in a Well-Mixed, Cold-Wall Reactor", Acta mater 49, 583-588.

R.B. Bird, et al., Transport Phenomena, New York, John Wiley & Sons, Inc., pp. 508-513 (1960).

S.R. Forrest, "Ultrathin Organic films grown by organic molecular beam deposited and related techniques", Chem. Rev. vol. 97, No. 6, pp. 793-1896 (Sep./Oct. 1997).

S. Wolf and R. N. Tauber, Silicon Processing for the VLSI Era, vol. I: Process Technology, pp. 73-123 (Lattice, 1986).

M. A. Baldo, et al., Organic Vapor Phase Deposition, Adv. Mater. 10, No. 18, pp. 1505-1514 (1998).

G. B. Stringfellow, Organometallic Vapor-Phase Epitaxy: Theory and Practice, pp. 55-283 (Academic, London, 1989).

G. H. Olsen, "Vapour-phase Epitaxy of GaInAsP", GaInAsP Alloy Semiconductors, edited by T. P. Pearsall (Wiley, New York, 1982), pp. 11-41.

P. E. Burrows, et al., "Organic Vapor Phase Deposition: a new method for the growth of organic thin films with large optical non-linearities", J. Cryst. Growth 156, pp. 91-98 (1995).

K. M. Vaeth, et al., "Chemical vapor deposition of poly (p-phenylene vinylene) based light emitting diodes with low turn-on voltages", Appl. Phys. Lett. 71(15), pp. 2091-2093 (Oct. 13, 1997).

M. A. Baldo, et al., "Low pressure organic vapor phase deposition of small molecular weight organic light emitting device structures", Appl. Phys. Lett. 71(21), pp. 3033-3035 (Nov. 24, 1997).

M. Shtein, et al., Material transport regimes and mechanisms for growth of molecular organic thin films using low-pressure organic vapor phase deposition, J. Appl. Phys. 89:2, pp. 1470-1476 (Jan. 15, 2001).

Sybil P. Parker, ed., McGraw-Hill Dictionary of Scientific and Technical Terms, Fifth Edition, p. 1516 (1994).

ASTM, Compilation of ASTM Standard Definitions, Eighth Edition, p. 380 (1994).

CRC Handbook of Chemistry and Physics, 54th edition, CRC Press, 1973, p. E-225.

Shtein et al., "Process and apparatus for organic vapor jet deposition", U.S. Appl. No. 10/233,470.

The Notice of Preliminary Rejection (Office Action) was issued by the Korean Patent Office (KIPO) on Apr. 23, 2009 in the Korean Patent Application No. 2004-7003206.

Evaporation (deposition). http://en.wikipedia.org/wiki/Evaporation_(deposition). Accessed Jul. 28, 2009.

* cited by examiner

DEVICE AND METHOD FOR ORGANIC VAPOR JET DEPOSITION

CROSS-REFERENCE TO RELATED APPLICATIONS

This patent application is a divisional of U.S. application Ser. No. 10/422,269, filed Apr. 23, 2003, which is a continuation-in-part of U.S. application Ser. No. 10/233,470, filed Sep. 4, 2002, which claims the benefit under 35 U.S.C. §119 (e) of U.S. Provisional Applications No. 60/317,215 (filed on Sep. 4, 2001), 60/316,264 (filed on Sep. 4, 2001), 60/316,968 (filed on Sep. 5, 2001), and 60/332,090 (filed on Nov. 21, 2001), and which is related to U.S. application Ser. No. 10/233,482 (filed on Sep. 4, 2002). All of these above-mentioned Applications are herein incorporated by reference in their entireties.

STATEMENT REGARDING GOVERNMENT RIGHTS

This invention was made with Government support under Contract No. F49620-92-J-04 24 awarded by the U.S. Air Force OSR (Office of Scientific Research). The government has certain rights in this invention.

RESEARCH AGREEMENT

The claimed invention was made by, on behalf of, and/or in connection with one or more of the following parties to a joint university-corporation research agreement: Princeton University, The University of Southern California, and Universal Display Corporation. The agreement was in effect on and before the date the claimed invention was made, and the claimed invention was made as a result of activities undertaken within the scope of the agreement.

FIELD OF THE INVENTION

The present invention is directed to a device and a method for facilitating the deposition and patterning of organic materials onto substrates utilizing the vapor transport mechanism of carrier gas streams.

BACKGROUND OF THE INVENTION

Molecular organic compounds are employed as active materials in a variety of applications, including organic light emitting diodes (OLEDs), photovoltaic cells, and thin films. Recent successes in fabricating OLEDs have driven the development of OLED displays (see S. R. Forrest, *Chem. Rev.* 97, 1793 (1997)). OLEDs make use of thin organic films that emit light when voltage is applied across the device. OLEDs are becoming an increasingly popular technology for applications such as flat panel displays, illumination, and backlighting. OLED configurations include double heterostructure, single heterostructure, and single layer, and a wide variety of organic materials may be used to fabricate OLEDs. Several OLED materials and configurations are described in U.S. Pat. No. 5,707,745, which is incorporated herein by reference in its entirety Typically, these thin (~100 nm) film devices (including OLEDs and photovoltaic cells) are grown by thermal evaporation in high vacuum, permitting the high degree of purity and structural control needed for reliable and efficient operation (see S. R. Forrest, *Chem. Rev.* 97, 1793 (1997)). However, control of film thickness uniformity and dopant concentrations over large areas needed for manufactured products can be difficult when using vacuum evaporation (see S. Wolf and R. N. Tauber, *Silicon Processing for the VLSI Era* (Lattice, 1986)). In addition, a considerable fraction of the evaporant coats the cold walls of the deposition chamber. Over time, inefficient use of materials results in a thick coating which can flake off, leading to particulate contamination of the system and substrate. The potential throughput for vacuum evaporated organic thin film devices is low, resulting in high production costs. Low-pressure organic vapor phase deposition (LP-OVPD) has been demonstrated recently as a superior alternative technique to vacuum thermal evaporation (VTE), in that OVPD improves control over dopant concentration of the deposited film, and is adaptable to rapid, particle-free, uniform deposition of organics on large-area substrates (see M. A. Baldo, M. Deutsch, P. E. Burrows, H. Gossenberger, M. Gerstenberg, V. S. Ban, and S. R. Forrest, *Adv. Mater.* 10, 1505 (1998)).

Organic vapor phase deposition (OVPD) is inherently different from the widely used vacuum thermal evaporation (VTE), in that it uses a carrier gas to transport organic vapors into a deposition chamber, where the molecules diffuse across a boundary layer and physisorb on the substrate. This method of film deposition is most similar to hydride vapor phase epitaxy used in the growth of III-V semiconductors (see G. B. Stringfellow, *Organometallic Vapor-Phase Epitaxy* (Academic, London, 1989); G. H. Olsen, in *GaInAsP*, edited by T. P. Pearsall (Wiley, New York, 1982)). In LP-OVPD, the organic compound is thermally evaporated and then transported through a hot-walled gas carrier tube into a deposition chamber by an inert carrier gas toward a cooled substrate where condensation occurs. Flow patterns may be engineered to achieve a substrate-selective, uniform distribution of organic vapors, resulting in a very uniform coating thickness and minimized materials waste.

Using atmospheric pressure OVPD, Burrows et al. (see P. E. Burrows, S. R. Forrest, L. S. Sapochak, J. Schwartz, P. Fenter, T. Buma, V. S. Ban, and J. L. Forrest, *J. Cryst. Growth* 156, 91 (1995)) first synthesized a nonlinear optical organic salt 4'-dimethylamino-N-methyl-4-stilbazolium tosylate. In a variation on this method, Vaeth and Jensen (see K. M. Vaeth and K. Jensen, *Appl. Phys. Lett.* 71, 2091 (1997)) used nitrogen to transport vapors of an aromatic precursor, which was polymerized on the substrate to yield films of poly (s-phenylene vinylene), a light-emitting polymer. Recently, Baldo and co-workers (see M. A. Baldo, V. G. Kozlov, P. E. Burrows, S. R. Forrest, V. S. Ban, B. Koene, and M. E. Thompson, *Appl. Phys. Lett.* 71, 3033 (1997)) have demonstrated what is believed to be the first LP-OVPD growth of a heterostructure OLED consisting of N,N-di-(3-methylphenyl)-N,N diphenyl-4,4-diaminobiphenyl and aluminum tris(8-hydroxyquinoline) ($Alq_3$), as well as an optically pumped organic laser consisting of rhodamine 6G doped into $Alq_3$. More recently, Shtein et al. have determined the physical mechanisms controlling the growth of amorphous organic thin films by the process of LP-OVPD (see M. Shtein, H. F. Gossenberger, J. B. Benziger, and S. R. Forrest, *J. Appl. Phys.* 89:2, 1470 (2001)).

Virtually all of the organic materials used in thin film devices have sufficiently high vapor pressures to be evaporated at temperatures below 400° C. and then to be transported in the vapor phase by a carrier gas such as argon or nitrogen. This allows for positioning of evaporation sources outside of the reactor tube (as in the case of metalorganic chemical vapor deposition (see S. Wolf and R. N. Tauber, *Silicon Processing for the VLSI Era* (Lattice, 1986); G. B. Stringfellow, *Organometallic Vapor-Phase Epitaxy* (Academic, London, 1989))), spatially separating the functions of evaporation and transport, thus leading to precise control over the deposition process.

Though these examples demonstrate that OVPD has certain advantages over VTE in the deposition of organic films, especially over large substrate areas, the prior art has not addressed the special problems that arise when depositing an array of organic material.

As is the case for fabrication of arrays using VTE, to adapt OVPD to OLED technology, a shadow mask delineating the shape of the desired pixel grid is placed close to the substrate to define the pattern of deposition on the substrate. Control of the shadow mask patterning is a critical step, for example, in the fabrication of full-color OLED-based displays (see U.S. Pat. No. 6,048,630, Burrows, et al.). Ideally, the resultant pattern on a substrate is identical to that cut into the shadow mask, with minimal lateral dispersion and optimal thickness uniformity of the deposited material. However, despite the overall advantages of OVPD in depositing organic layers, the use of the shadow mask in OVPD has certain disadvantages including: significant lateral dispersion compared to VTE; material waste; potential for dust contamination on the film from the mask; and difficulty in controlling the mask-substrate separation for large area applications.

SUMMARY OF THE INVENTION

It is an object of the present invention to provide a device for the patterned deposition of organic materials onto substrates that utilizes the vapor transport mechanisms of organic vapor phase deposition. It is also an object of the present invention to provide a method for the patterned deposition of organic materials onto substrates, without the need for a shadow mask.

In an embodiment of the device, the device comprises one or more nozzles, and an apparatus integrally connected to the one or more nozzles. The one or more nozzles direct the flow of the organic vapor and the carrier gas out of the device, for example, onto a substrate. The apparatus includes one or more source cells, each source cell containing an organic material, a carrier gas inlet leading to each source cell, a carrier gas outlet leading from each source cell to the one or more nozzles, and a first valve capable of controlling the flow of the carrier gas through the one or more source cells. Preferably, the organic material is a small molecule material, although other materials, such as monomers, oligomers, or dendrimers, may also be used as the organic material in the invention.

In an embodiment of the method of the invention, a method of depositing an organic material is provided. The method comprises moving a substrate relative to an apparatus integrally connected to one or more nozzles, wherein the apparatus comprises: one or more source cells, each source cell containing an organic material; a carrier gas inlet leading to each source cell; a carrier gas outlet leading from each source cell to the one or more nozzles; and a first valve capable of controlling the flow of a carrier gas through the one or more source cells. The method also comprises controlling the composition of the organic material and/or the rate of the organic material which is ejected by the one or more nozzles while moving the substrate relative to the apparatus, resulting in an organic material being deposited over the substrate.

DETAILED DESCRIPTION

The present invention will be described with reference to the following illustrative embodiments.

As described in U.S. application Ser. No. 10/233,470, filed Sep. 4, 2002, which is incorporated herein by reference in its entirety, organic vapor jet deposition (OVJD) is a technique that allows for direct patterning of organic films on substrates. OVJD uses an inert carrier gas, such as nitrogen or argon, to transport the organic vapors from their source(s) and eject them from one or more nozzles, producing collimated jets of organic vapor and carrier gas. Upon striking the substrate, the organic vapors are condensed out of the jet, forming a patterned deposit, whose shape can be controlled by engineering the nozzle shape and flow dynamics of the organic vapor and carrier gas.

Embodiments of the present invention are directed to a device for the patterned deposition of organic materials onto substrates utilizing the vapor transport mechanisms of organic vapor phase deposition, and to a method of using such a device to deposit an organic material. For example, an embodiment of the device can be used to pattern both single-component and doped organic thin films on a substrate. Furthermore, embodiments of the device of the invention can be used for the rapid deposition of laterally patterned, doped films and multi-layer structures.

Figure 1:
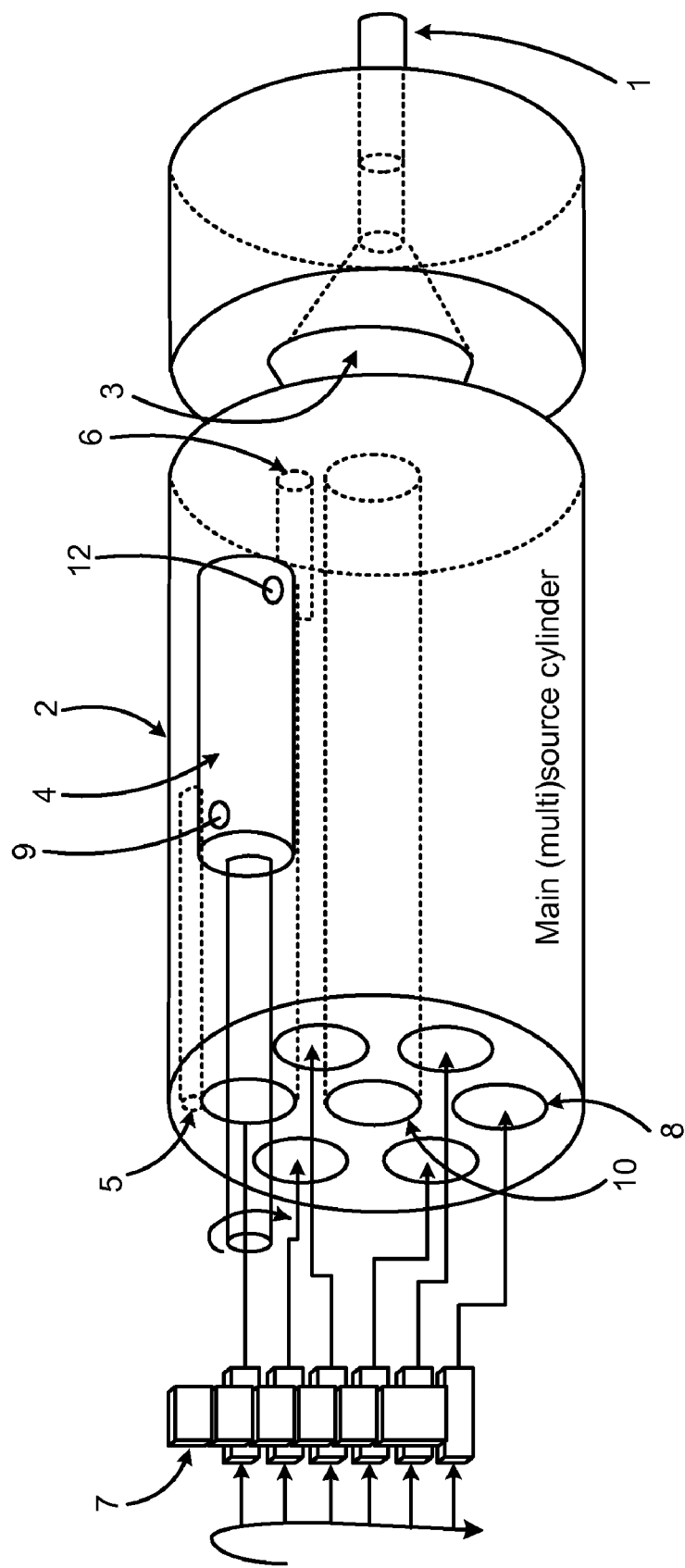
FIG. 1 shows an embodiment of the device of the present invention.

In an embodiment of the device as depicted in FIG. 1, the device includes a nozzle 1, and an apparatus 2, with one or more source cells 4, integrally connected to the nozzle 1 via a mixing chamber 3. In this embodiment, the integral connection between the apparatus 2 and the one or more nozzles 1 refers to their close, proximal relationship. Although the apparatus 2 and the one or more nozzles 1 are not necessarily rigidly connected to each other nor made from a single piece of material, they are situated close enough together such that they can be moved together as a single unit. The apparatus 2 also includes a carrier gas inlet channel 5 leading to each source cell 4, a carrier gas outlet channel 6 leading from each source cell 4 to the mixing chamber 3, and a first valve 7 capable of controlling the flow of a carrier gas through the one or more source cells 4. In addition, the apparatus 2 includes a dilution channel 10 located in the middle of the apparatus 2 which can be used to allow carrier gas to pass through to the mixing chamber 3 without passing through a source cell 4, thereby diluting the concentrations of the organic vapors in the mixing chamber 3. The dilution channel 10 can also serve as a pressure relief channel for the device. In addition, although the dilution channel 10 is located in the middle of the apparatus 2 in the embodiment of the device as depicted in FIG. 1, other embodiments of the device can include the dilution channel 10 located at other positions within the apparatus 2.

In a preferred embodiment of the invention, there are a plurality of source cells 4 to enable the deposition of multiple organic materials through a single mixing chamber 3 and nozzle 1. The flow of carrier gas through the source cells 4 may be separately controlled for each source cell 4, such that different organic materials or different mixtures of organic materials may be deposited at any given time. For example, as is known in the art of manufacturing OLEDs, the emissive layer of an OLED may contain an emissive organic molecule (a dopant) doped into a different organic host material. Thus, this preferred embodiment of the invention could include a source cell 4 containing an organic dopant material, such as fac tris(2-phenylpyridine) iridium (Ir(ppy)$_3$), and another source cell 4 containing an organic host material, such as 4,4'-N,N'-dicarbazole-biphenyl (CBP), wherein the flow of carrier gas through these source cells 4 is controlled such that the desired amounts of CBP and Ir(ppy)$_3$ are transported into the mixing chamber 3. Thereafter, the resulting organic layer deposited by such an embodiment of the device comprises a CBP layer doped with Ir(ppy)$_3$.

In the embodiment shown in FIG. 1, the apparatus 2 comprises a single-piece structure in the form of a cylinder containing one or more source cells 4 (only one of which is shown in FIG. 1), with each source cell containing an organic material. Each of the source cells 4, which are also in the form of cylinders, are contained in a cylindrical source bore 8 in the apparatus. Although both the apparatus 2 and the source cells 4 (along with the accompanying cylindrical source bores 8) are in the form of a cylinder in FIG. 1, the apparatus and the source cells may be in various other geometrical forms, including but not limited to, a square block, a rectangular block, a hexagonal block, and an octagonal block. Furthermore, both the apparatus and the source cells may have tapered geometries, such that the inlet and outlet ends of the apparatus and/or source cell would have different radii or dimensions. In addition, although the embodiment of the device shown in FIG. 1 includes a single source cell 4 contained in a cylindrical source bore 8, additional source cells 4 may be positioned in a linear arrangement in a single cylindrical source bore 8.

In other embodiments of the device of the invention, the apparatus is not in the form of a single-piece structure, but instead comprises one or more separate structures, wherein each structure contains one of the one or more source cells. Furthermore, the separate structures could be rigidly attached to each other to increase the strength of the apparatus as a whole. The structure could be any type of physical form, such as a tube or a hollow square block, capable of containing one or more source cells. For example, the apparatus could comprise one or more tubes, with each tube containing one of the one or more source cells.

In the embodiment shown in FIG. 1, the first valve 7 includes a plurality of source-cell valves, wherein each source-cell valve is associated with each carrier gas inlet channel 5. That is, each source-cell valve corresponds to a source cell 4 such that the source-cell valve is capable of controlling the flow of the carrier gas into each carrier gas inlet channel 5. By carefully selecting the opening and closing of selected source-cell valves, the device shown in FIG. 1 can be used for the selective patterned deposition of organic vapors, for example, on a substrate.

In the embodiment of the invention shown in FIG. 1, the source cell 4 has a first cylindrical portion having a first radius, while each of the cylindrical source bores 8 has a second radius which is slightly larger than the first radius of the source cell 4. As used herein, the phrase "slightly larger" means allowing for the rotation of the source cells 4 within the cylindrical source bore 8, but impeding the flow of carrier gas therethrough. Also shown in FIG. 1 is a valve 7 including an aperture 9 in the source cell 4 that aligns with the inlet channel 5 when the source cell 4 is in a first position, and does not align with the inlet channel 5 when the source cell 4 is in a second position. By this arrangement, shown in FIG. 1 and described above, each source cell 4 can be turned to an "on" position by rotating the source cell 4 about its own longitudinal axis into the first position, wherein the aperture 9 does align with the inlet channel 5. In this first position, carrier gas can flow through the carrier gas inlet channel 5, the source cell 4, the carrier gas outlet channel 6, the mixing chamber 3 and the nozzle 1. In addition, each source cell 4 can be nearly hermetically sealed in an "off" position by rotating the source cell 4 about its own longitudinal axis into the second position, wherein the aperture 9 does not align with the inlet channel 5, thereby not allowing for the flow of carrier gas through the source cell 4.

Preferably, in the embodiment shown in FIG. 1, the source cell 4 with a first cylindrical portion having a first radius, and each of the cylindrical source bores 8 having a second radius which is slightly larger than the first radius of the source cell 4, are sized and fitted such that hot-valving occurs when using the device. As used herein, the term "hot-valving" refers to the opening and/or closing of a hot, gas-tight seal between a source cell 4 and a cylindrical source bore 8. The hot (preferably in the range of about 150° to about 500° C., more preferably about 215° C.), gas-tight seal is preferred to prevent the undesired passage of carrier gas through the apparatus and out of the nozzle, which could generally not be achieved with the use of lubricants and/or elastomeric seals (such as elastomeric o-rings) which are commonly used in liquid-based systems, such as ink-jet printing methods and devices. In addition, known sealants and lubricants for gas-based systems, such as teflon and graphite, can be used in accordance with the invention.

Figure 2:
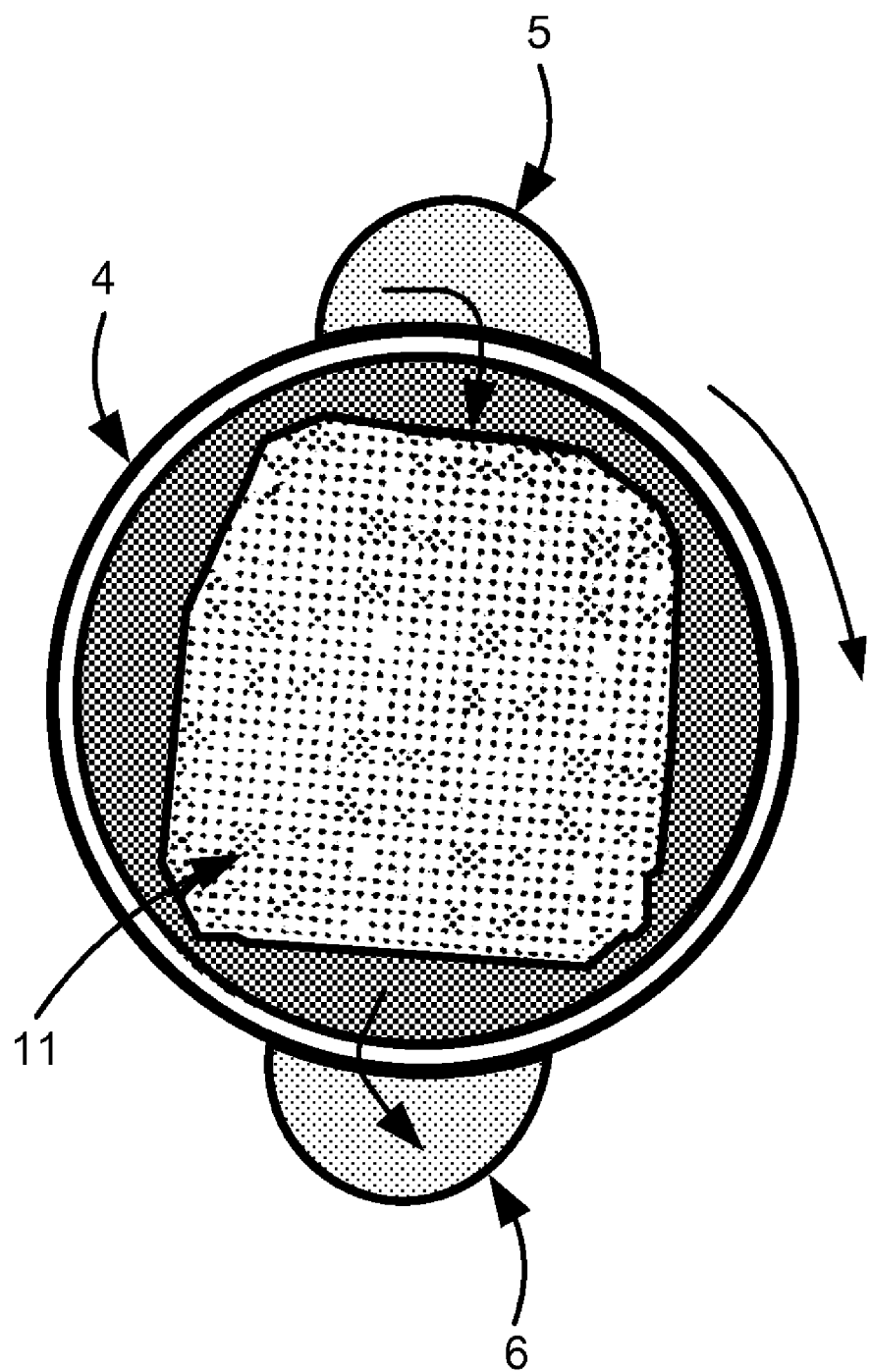
FIG. 2 shows an enlarged cross-sectional view of a source cell shown in FIG. 1.
Figure 3:
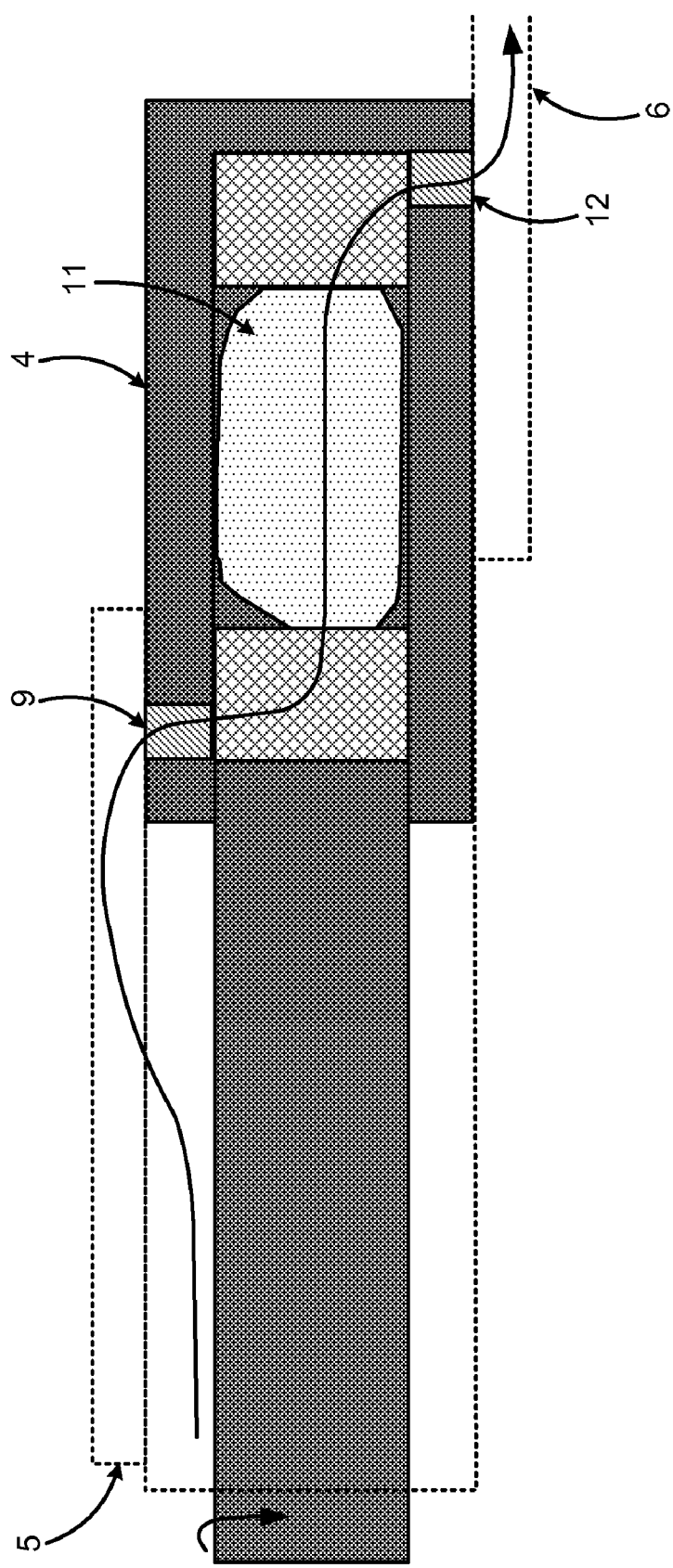
FIG. 3 shows an enlarged side view of a source cell shown in FIG. 1.

FIG. 2 shows an enlarged version of the embodiment of the source cell 4 shown in FIG. 1. The reference numbers in FIGS. 1-5 are consistent throughout and refer to the same device components in each Figure. FIG. 2 shows a cross-sectional view of the source cell 4, while FIG. 3 shows a side view of the source cell 4. As seen in FIGS. 1 and 2, the source cell 4 is in the form of a cylinder, which may be opened for the purpose of cleaning and filling with the organic material 11. The source cell 4 has an inlet aperture 9 and an outlet aperture 12. As can be seen by the arrow in FIG. 3, the flow of the carrier gas is directed through the inlet channel 5, the inlet aperture 9, the organic material 11, the outlet aperture 12, and the outlet channel 6, the path of which provides for more efficient organic vapor pick-up by the carrier gas.

The preferred temperatures and pressures to be employed in the method and with the device of the present invention are the same as those typically employed in organic vapor phase deposition. That is, preferred operating pressures for the invention range from 0.01 to 10 Torr. In addition, preferred operating temperatures for the invention range from about 150° to about 500° C. This temperature range is preferred because at temperatures below about 150° C. the resulting vapor pressure of the organic material is generally too low to evaporate the organic material and transport it in the vapor phase, while at temperatures above about 500° C. the decomposition of the organic material is a possible result.

In another embodiment of the invention, the one or more source cells may be heated to generate the desired vapor pressure of the organic material within the one or more source cells. The heating of the one or more source cells can be accomplished via a heating element and/or an insulating material positioned in any way such that heat reaches the one or more source cells. Such heating elements and insulating materials are known in the art, and are within the scope of the present invention. For example, a separate heating element could be positioned around each individual source cell, or a single heating element could be positioned around the entire apparatus which includes the one or more source cells. Thus, in the embodiment of the device shown in FIG. 1, although not shown, a heating element could be placed around the source cell 4, or a heating element could be placed around the apparatus 2.

In addition, in some embodiments of the device of the invention, the temperature of each of the one or more source cells may be controlled as follows. The heating element can generate an axial temperature gradient along the structure which it is surrounding or adjacent to. For example, if the heating element is positioned around the apparatus, such as the cylindrical apparatus 2 shown in FIG. 1, an axial temperature gradient is generated along the cylinder, while the source cell 4 can be pulled out of or pushed into its cylindrical source bore 8 to a desired position corresponding to the desired temperature value. In the embodiment of the device shown in FIG. 1, the range of adjustability is controlled by the temperature gradient along the apparatus 2, the distance between the inlet and outlet orifices of the source cell 4, as well as the distance and stagger between the carrier gas inlet channel 5 and the carrier gas outlet channel 6. In general, the rate of organic vapor delivery is controlled jointly by the source cell temperature, the flow rate of the carrier gas through the source cell 4, and the flow rate of the carrier gas through the dilution channel 10.

Embodiments of the device of the present invention are preferably comprised of a metallic material, including but not limited to, aluminum, stainless steel, titanium, and other alloys. Preferably, the components of the device of the present invention, particularly the source cells and the apparatus in which the source bores contain the source cells, are comprised of materials having a similar coefficient of thermal expansion (i.e., within about 10% of one another), and more preferably, are comprised of the same material. By employing materials in the device with a similar coefficient of thermal expansion, differential expansion upon heating of the source cells and the apparatus in which the source bores contain the source cells is largely avoided. Thus, upon heating the device to the desired temperature, the device will not encounter the potential problems of a source cell expanding in a source bore and "locking-up" therein, or of a gap developing between the source cell and the source cell allowing for the undesired passage of carrier gas therethrough. In addition, the device of the invention can be manufactured by methods known in the art, including but not limited to, casting, forging or machining.

In another embodiment of the invention, the one or more nozzles of the device are comprised of a low-emissivity material. Because the one or more nozzles of the device are preferably within about 1 millimeter from the substrate, when a low-emissivity material, such as a ceramic, is used as the material for the one or more nozzles, it largely avoids the problem of possible evaporation of previously deposited organic layers on the substrate because the low-emissivity material may emit less heat than other materials, thereby lessening the possibility of evaporating such organic layers.

Figure 4:
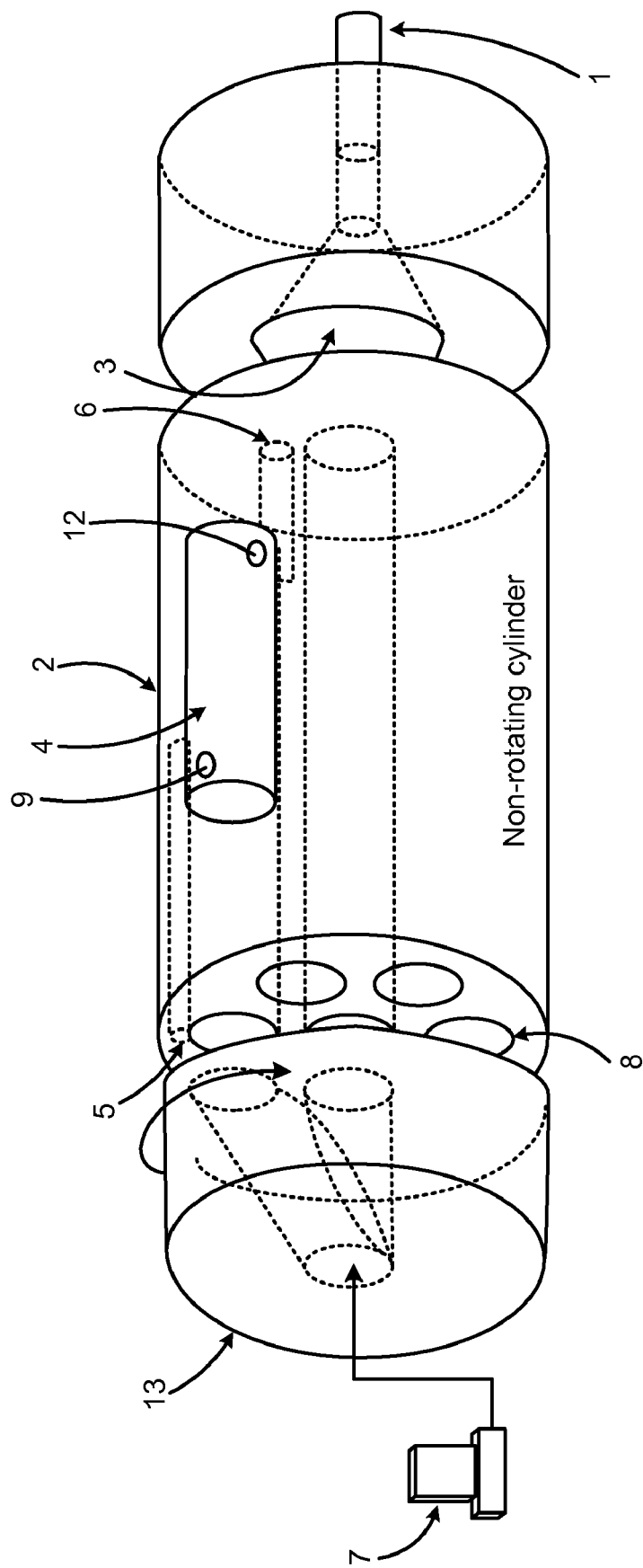
FIG. 4 shows another embodiment of the device of the present invention.

In another embodiment of the device, as shown in FIG. 4, the device can further include a selector 13 located next to the apparatus 2 which is capable of controlling the flow of carrier gas into each carrier gas inlet channel 5. In FIG. 4, the selector 13 is placed upstream of the apparatus 2, and the selector 13 can rotate rapidly about its own longitudinal axis to selectively direct the flow of the carrier gas into the inlet channels 5 and the cylindrical source bores 8. By carefully selecting the rate at which the selector 13 rotates, the device shown in FIG. 4 can be used for the selective patterned deposition of organic vapors, for example, on a substrate.

Figure 5:
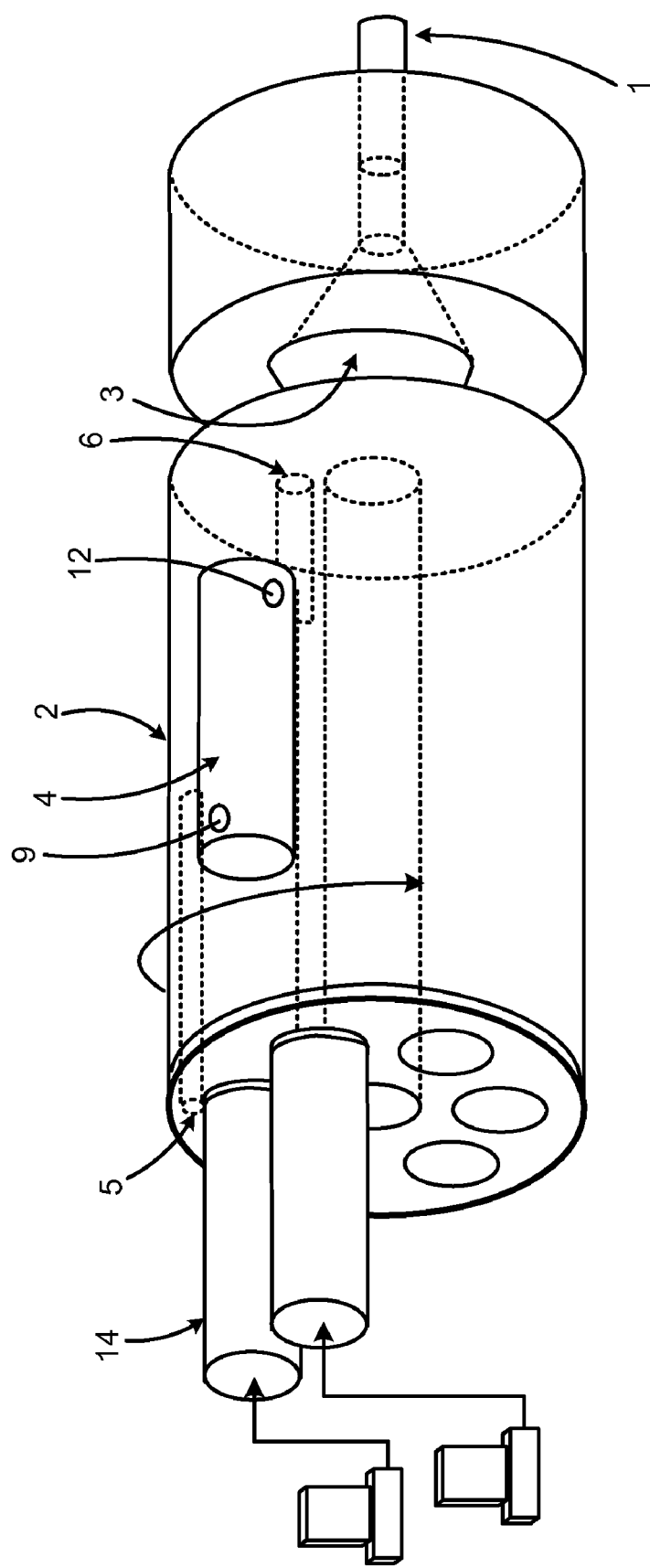
FIG. 5 shows a further embodiment of the device of the present invention.

In another embodiment of the device, as shown in FIG. 5, the entire apparatus 2 is capable of rotating about its own longitudinal axis. In this embodiment, the flow of carrier gas into each carrier gas inlet channel 5 is controlled by the rotational position of the apparatus 2. For example, in the embodiment shown in FIG. 5, there are two stationary inlet tubes 14 placed upstream of the apparatus 2, which can rotate rapidly about its own longitudinal axis to selectively direct the flow of the carrier gas from the stationary inlet tube 14 into the selected source cell 4 By carefully selecting the rate at which the apparatus 2 rotates, the device shown in FIG. 5 can be used for the selective patterned deposition of organic vapors, for example, on a substrate.

As the device of the invention can include one or more nozzles and one or more source cells, embodiments of the device can include any combination of nozzle and source cell quantities. For example, an embodiment of the device could include one nozzle and three source cells, wherein the three source cells include a first source cell containing a first organic material capable of emitting a blue spectra of light, a second source cell containing a second organic material capable of emitting a green spectra of light, and a third source sell containing a third organic material capable of emitting a red spectra of light. Another embodiment of the device could include an array of nozzles with one or more source cells, while still another embodiment of the invention could includ an array of devices, each with one nozzle and a plurality of source cells. All such combinations of nozzle and source cell quantities are within the scope of the device of the present invention.

In an embodiment of the method of the invention, a method of depositing an organic material is provided. The organic material may be deposited, for example, as an amorphous or crystalline film. The method comprises moving a substrate relative to an apparatus integrally connected to one or more nozzles. The apparatus comprises: one or more source cells, each source cell containing an organic material; a carrier gas inlet leading to each source cell; a carrier gas outlet leading from each source cell to one or more nozzles; and a first valve capable of controlling the flow of a carrier gas through the one or more source cells. The method also comprises controlling the composition of the organic material and/or the rate of the organic material which is ejected by the one or more nozzles while moving the substrate relative to the apparatus, resulting in an organic material being deposited over the substrate.

According to this embodiment of the method of the invention, the moving of a substrate relative to an apparatus can be accomplished in more than one way. For example, the substrate can be stationary and the apparatus can be moved in a direction parallel to the plane of the substrate. In addition, the apparatus can be stationary and the substrate can be moved in a direction parallel to the plane of the substrate.

Furthermore, any embodiment of the apparatus or device of the invention can be used in accordance with the method of the invention. For example, the embodiment of the device which includes a selector located next to the apparatus which is capable of controlling the flow of carrier gas into each carrier gas inlet channel may be used to control the composition of the organic material and/or the rate of the organic material which is ejected by the apparatus while moving the substrate relative to the apparatus. In addition, the embodiment of the apparatus which is capable of rotating about its own longitudinal axis may be used to control the composition of the organic material and/or the rate of the organic material which is ejected by the apparatus while moving the substrate relative to the apparatus.

Embodiments of the method of the invention can be used to facilitate the rapid deposition and patterning of organic materials on substrates. For example, the phrase "rapid deposition" may refer to the deposition of an entire display (about 3 million pixels) in about 10 seconds. Such rapid deposition can be achieved, for example, by an embodiment of the device of the invention comprising a row of nozzles and a plurality of source cells, wherein the row of nozzles could move across a substrate depositing a different organic layer with each pass over the substrate. For example, after five passes over the substrate, a five-layered OLED would result. Alternatively, the same embodiment of the device could make just one pass over the substrate and still produce a five-layered OLED, whereby the source cells of the device would be switched over each pixel site such that five different layers resulted at each pixel site, provided the device had a sufficient switching time for the source cells (preferably about 10 milliseconds).

Such rapid deposition can be achieved with the device of the invention because of the compactness of the device as compared to previous devices. By positioning the organic material to be transported by the carrier gas very close to the substrate on which it is to be deposited in accordance with the present invention, there is less latency involved in depositing the organic layer as compared to previous configurations with a longer distance between the organic material to be transported and the substrate on which it is to be deposited. This longer distance between the organic material and the substrate which is present in previous configurations needs to be cleared out or flushed of any previous organic material being transported by a carrier gas before a second organic material can be deposited via such a configuration. However, the compactness of the device of the present invention allows the device to be able to rapidly deposit different organic materials with rapid switching between the different source cells containing the different organic materials. Preferably, the source cells containing the organic materials are no greater than about 10 cm from the one or more nozzles of the device, with the one or more nozzles preferably being within about 1 millimeter from th substrate.

Such rapid deposition and patterning includes both single-component and doped organic thin films deposited on a substrate. Applications of such patterned organic materials on a substrate include, but are not limited to, electronic, optoelectronic, and optical device fabrication. Furthermore, the device and method of the present invention are readily adaptable to both large-scale deposition processes, such as the fabrication of wall-sized displays, as well as small-scale deposition processes, such as portable organic vapor jet printers for use in research laboratories an/or private homes.

The present invention will now be described in detail with respect to showing how certain specific representative embodiments thereof can be made, the materials, apparatus and process steps being understood as examples that are intended to be illustrative only. In particular, the invention is not intended to be limited to the methods, materials, conditions, process parameters, apparatus and the like specifically recited herein.

EXAMPLES

Example 1

In Example 1, an embodiment of the device of the invention as seen in FIG. 1 was used to deposit an organic material on a silicon substrate. That is, the device included a single source cell 4 containing an organic material, aluminum tris(8-hydroxyquinoline)($Alq_3$), and a single nozzle 1 with an inner diameter of about 350 μm. In this example, the distance between the end of the nozzle 1 and the substrate was in the range of about 0.5 to about 1.0 mm, the deposition pressure was about 270 mTorr, and the source cell temperature was about 222° C.

Figure 6:
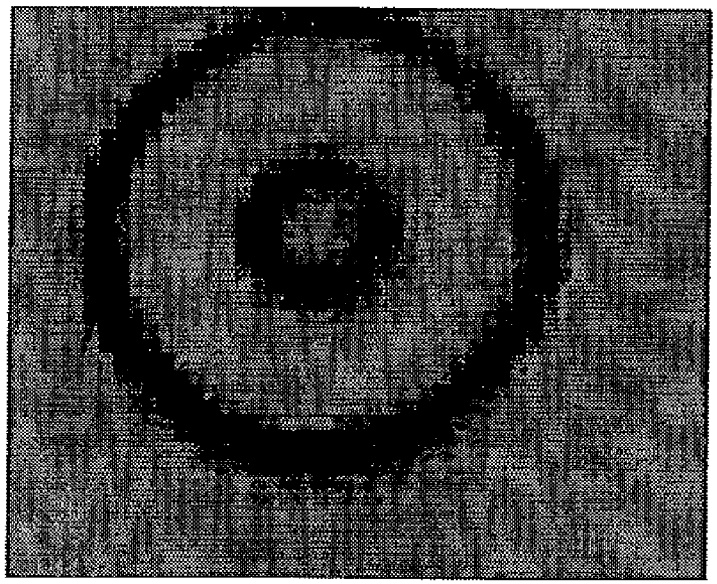
FIG. 6 shows a photograph of the deposited organic material from Example 1 showing interference fringes due to the variation in thickness of the deposited organic material.

FIG. 6 shows a photograph of the deposited $Alq_3$ from Example 1 (from an overhead view looking down on the deposited $Alq_3$) showing interference fringes due to the variation in thickness of the deposited $Alq_3$. The width of the deposited $Alq_3$ shown in FIG. 6 is approximately 500 μm.

Example 2

In Example 2, an embodiment of the device of the invention as seen in FIG. 1 was used to deposit an organic material on a silicon substrate. That is, the device included a single source cell 4 containing an organic material, $Alq_3$, and a single nozzle 1. However, in the embodiment of the device used in Example 2, the nozzle 1 had an inner diameter of approximately 50 μm. In this example, the distance between the end of the nozzle 1 and the substrate was in the range of about 0.5 to about 1.0 mm, the deposition pressure was about 270 mTorr, and the source cell temperature was varied within the range of 209° to 225° C.

Figure 7:
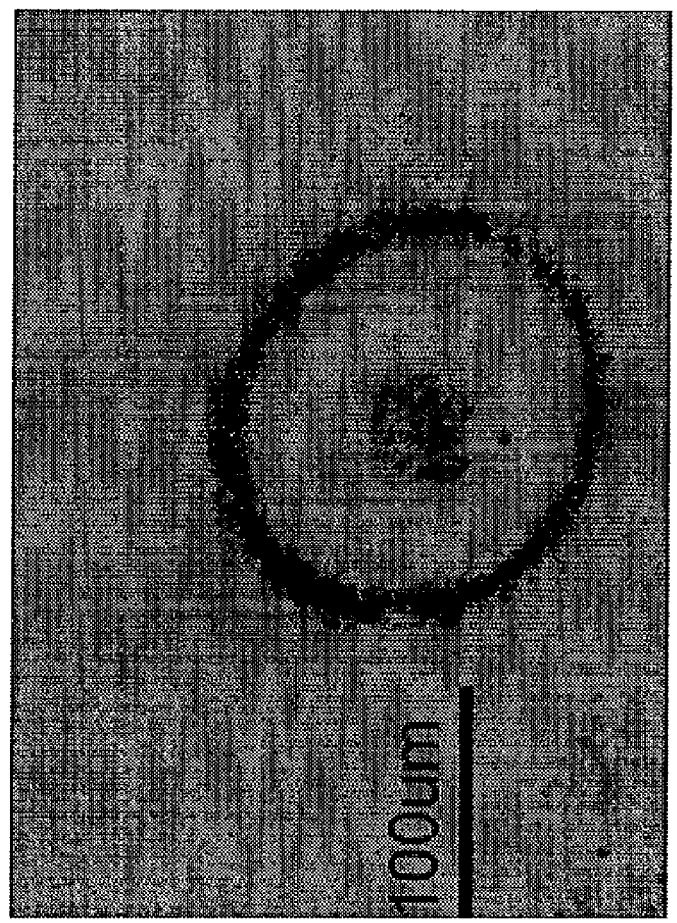
FIG. 7 shows a photograph of the deposited organic material from Example 2 showing interference fringes due to the variation in thickness of the deposited organic material.

FIG. 7 shows a photograph of the deposited $Alq_3$ from Example 2 (from an overhead view looking down on the deposited $Alq_3$) showing interference fringes due to the variation in thickness of the deposited $Alq_3$. The width of the deposited $Alq_3$ shown in FIG. 7 is approximately 100 μm.

Figure 8:
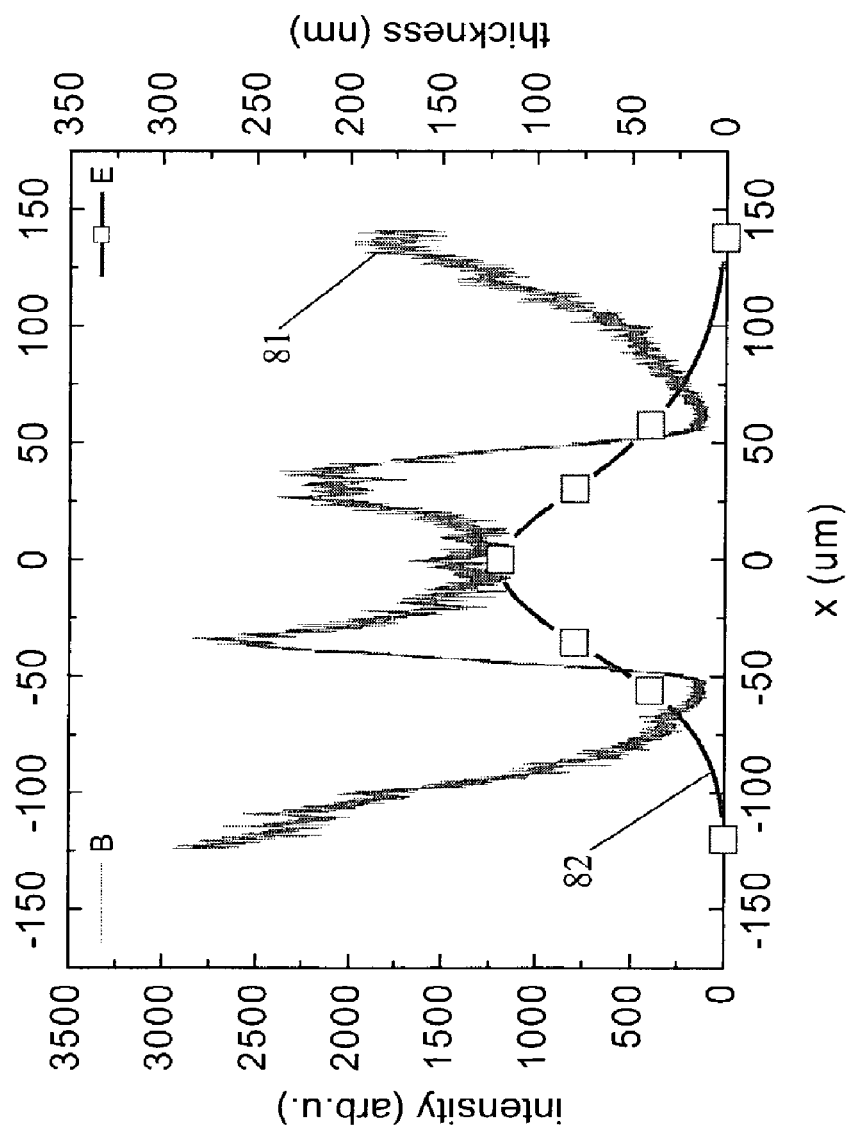
FIG. 8 shows the light intensity profile of the photograph of the deposited organic material from Example 2, and the physical shape of the deposited organic material from Example 2.

The physical shape of the deposited $Alq_3$ from Example 2 is shown in FIG. 8. Curve 81 represents the light intensity profile of the photograph of the deposited $Alq_3$ from Example 2 (which is shown in FIG. 7), graphed as arbitrary units of intensity as a function of x (μm), wherein x represent the distance from the center (0) of the deposited $Alq_3$. The light intensity profile 81 was then translated into curve 82 which represents the physical shape of the deposited $Alq_3$ from Example 2, plotted as thickness (nm) as a function of x (μm). As can be seen in FIG. 8, curve 82 approximates a bell-shaped curve, wherein during deposition the center of the nozzle 1 is located approximately over the center of the deposited organic material, denoted on the x-axis of FIG. 8 by the numeral "0." Thus, in order to flatten-out this bell-shaped curve and deposit an organic material with a flatter profile, the nozzle could be dithered over a desired distance during the deposition process thereby producing a flatter deposited organic material than that shown in FIG. 8. Furthermore, a device of the invention could include more than one nozzle 1 arranged in a linear array with proper spacing between the nozzles such that the bell-shaped deposits from each nozzle 1 would overlap to the extent that the profile of the resulting organic material deposited from the array of nozzles would more closely approximate a plateau rather than a bell-shaped curve.

Example 3

In Example 3, an embodiment of the device of the invention as seen in FIG. 1 was used to deposit an organic material as part of the fabrication of an OLED. The structure of the fabricated OLED 98 can be seen in FIG. 9.

The process used to fabricate the OLED 98 shown in FIG. 9 proceeded as follows. A substrate 91 was comprised of a 12.5 mm×12.5 mm×1 mm glass slide. The substrate 91 was pre-coated with a layer 92 of indium tin oxide (ITO), which served as the anode of the OLED 98 structure. A hole injection layer 93 was deposited onto the ITO-layer 92, wherein the hole injection layer 93 comprised about 100 Å of copper phthalocyanine (CuPc). A hole transporting layer 94 was deposited onto the hole injection layer 93, wherein the hole transporting layer 94 comprised about 450 Å of 4,4'-bis[N-(1-napthyl)-N-phenyl-amino] biphenyl ($\alpha$-NPD).

Figure 9:
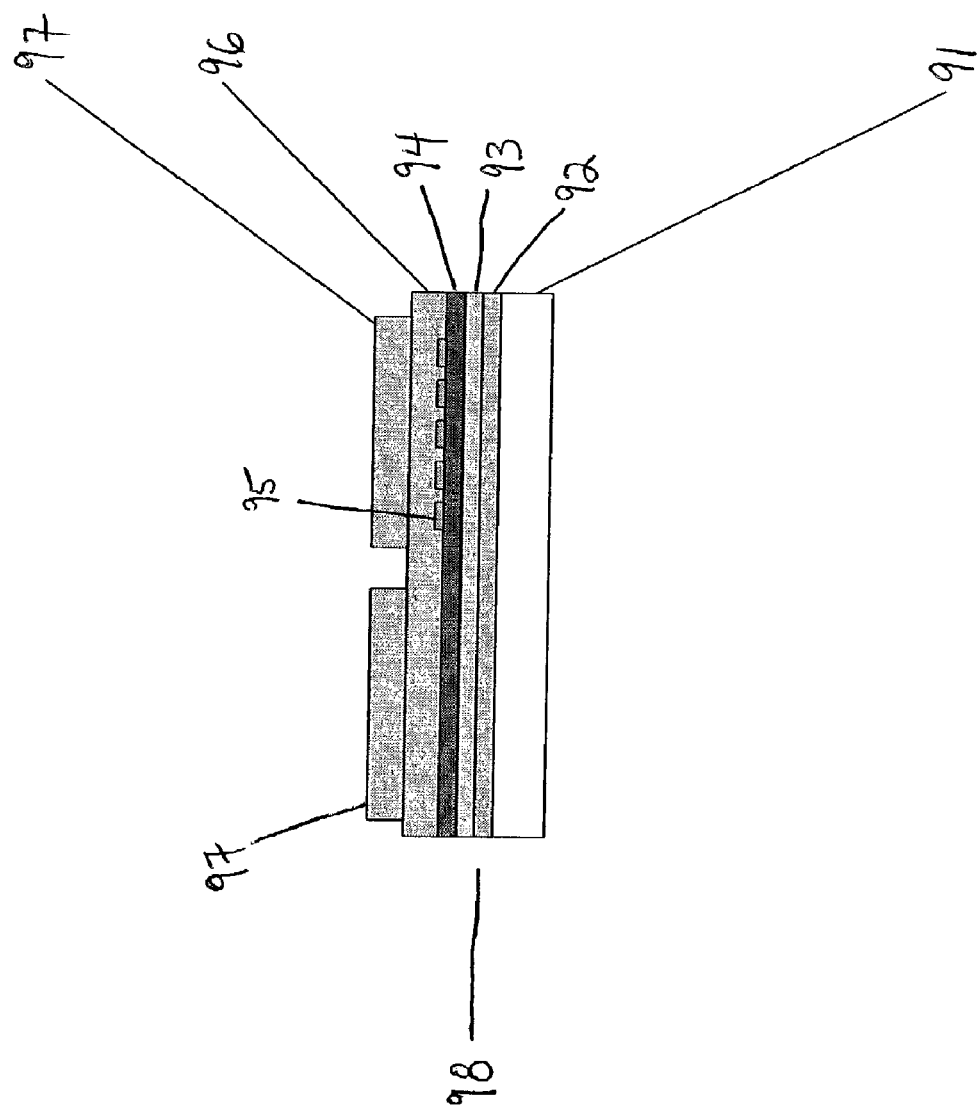
FIG. 9 shows the structure of an OLED 98 fabricated in-part by an embodiment of the device of the invention.

Next, an embodiment of the device of the invention as seen in FIG. 1 was used to deposit dots 95 of the organic material $Alq_3$, a green emitter, onto the hole transporting layer 94, but only on one half of the hole transporting layer 94 as shown in FIG. 9. The deposited dots 95 were each approximately 150 Å thick. The device used to deposit the dots 95 included a single source cell 4 containing the $Alq_3$, and a single nozzle 1 having a length of about 5 mm and an inner diameter of about 50 μm. While depositing the dots 95, the distance between the end of the nozzle 1 and the hole transporting layer 94 was about 200 μm, the deposition pressure was about 275 mTorr, the source cell temperature was about 220° C., and the deposition rate was about 1.25 Å/sec.

An electron transporting layer 96 was then deposited over the dots 95, and over the portions of the hole transporting layer 94 which were not covered by the dots 95. The electron transporting layer 96 comprised about 500 Å of 2,9-dimethyl-4,7-diphenyl-1,10-phenanthroline (BCP). Next, cathodes 97 were deposited over the electron transporting layer 96, one over the half of the OLED 98 containing the dots 95, and one over the other half of the OLED 98. The cathodes 97 each comprised an about 7 Å-thick layer of LiF, capped by an about 1500 Å-thick layer of Al. The depositions of all of the layers of the OLED 98 of Example 3, except for the deposition of the dots 95 as discussed above, were done via high vacuum (~$10^{-6}$ Torr) thermal evaporation.

Figure 10:
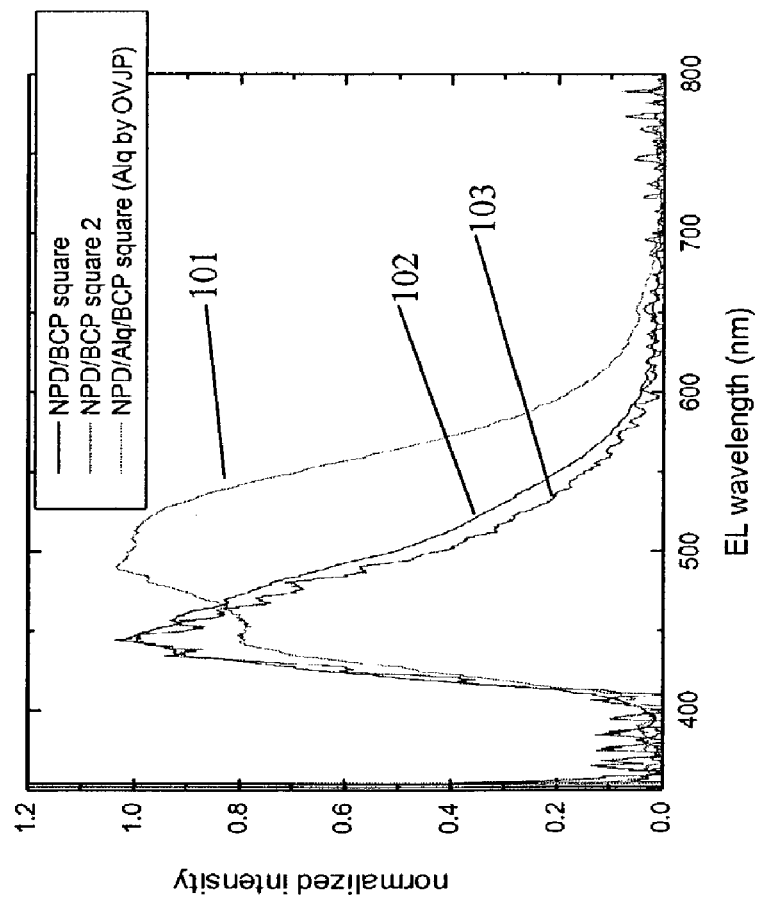
FIG. 10 shows a plot of the electroluminescent (EL) intensity as a function of wavelength for the OLED 98 fabricated in Example 3.

FIG. 10 shows a depiction of the electroluminescent (EL) intensity as a function of wavelength for the OLED 98 fabricated in Example 3. The three different curves shown in FIG. 10 denote different portions of the OLED 98; namely, curve 101 represents that portion of the OLED 98 containing the dots 95, while curves 102 and 103 represent two different locations within that portion of the OLED 98 not containing the dots 95. Thus, the only OLED structural difference represented by these curves 101, 102 and 103 is that curve 101 includes $Alq_3$ dots 95 deposited by an embodiment of the device of the invention as described above. As can be seen in FIG. 10, although all three curves 101, 102 and 103 display a peak EL intensity at about 445 nm, only curve 101 has an additional peak intensity at about 520 nm. This additional peak at about 520 nm shown in curve 1 can be attributed to the green emission of the $Alq_3$ dots 95 which were deposited by the embodiment of the device of the invention as described above.

Although the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A method of depositing an organic material, comprising:
    moving an apparatus integrally connected to one or more nozzles in a direction substantially parallel to the plane of a substrate, the apparatus comprising:
        one or more source cells, each source cell containing an organic material;
        a carrier gas inlet leading to each source cell;
        a carrier gas outlet leading from each source cell to the one or more nozzles; and
        a first valve capable of controlling the flow of a carrier gas through the one or more source cells; and
    controlling at least one of the composition of the organic material and the rate of the organic material ejected by the one or more nozzles while moving the apparatus, such that an organic material is deposited over the substrate.

2. The method of claim 1, wherein the at least one of the composition of the organic material and the rate of the organic material ejected by the one or more nozzles is controlled by rotating the apparatus about an axis of the apparatus.

3. The method of claim 1, wherein the at least one of the composition of the organic material and the rate of the organic material ejected by the one or more nozzles is controlled by rotating a selector located next to the apparatus.

4. The method of claim 1, wherein the at least one of the composition of the organic material and the rate of the organic material ejected by the one or more nozzles is controlled by controlling the flow of carrier gas through the one or more source cells by the use of the first valve.

5. The method of claim 1, wherein the one or more nozzles comprise a low-emissivity material.

6. The method of claim 1, wherein each of the one or more source cells is no greater than about 10 cm from at least one of the one or more nozzles.

7. The method of claim 1, wherein the apparatus further comprises a single-piece structure containing the one or more source cells.

8. The method of claim 1, wherein the one or more nozzles are not greater than about 1 mm from the substrate.

9. The method of claim 1, further comprising:
    depositing a plurality of layers on the substrate, each layer comprising the organic material contained in at least one of the one or more source cells.

10. The method of claim 9, wherein the plurality of layers are deposited during a single pass of the substrate relative to the apparatus.

11. The method of claim 10, further comprising:
    for each deposited layer, directing the flow of carrier gas through a source cell containing the organic material for the layer.

12. The method of claim 9, wherein each of the plurality of layers is deposited in a separate pass of the substrate relative to the apparatus.

13. The method of claim 1, wherein the organic material is deposited in a layer having a lateral pattern.

14. The method of claim 13, wherein the layer comprises a plurality of physically-separate features.

15. The method of claim 13, wherein the layer comprises a plurality of pixels.

16. A method of depositing an organic material, comprising:
    moving a substrate relative to an apparatus integrally connected to one or more nozzles, the apparatus comprising:

one or more source cells, each source cell containing an organic material;

a carrier gas inlet leading to each source cell;

a carrier gas outlet leading from each source cell to the one or more nozzles; and a first valve capable of controlling the flow of a carrier gas through the one or more source cells; and rotating the apparatus about an axis of the apparatus to control at least one of the composition of the organic material and the rate of the organic material ejected by the one or more nozzles while moving the substrate relative to the apparatus, such that an organic material is deposited over the substrate.

17. The method of claim 16, wherein the substrate is stationary and the apparatus is moved in a direction parallel to the plane of the substrate.

18. The method of claim 16, wherein the apparatus is stationary and the substrate is moved in a direction parallel to the plane of the substrate.

19. The method of claim 16, wherein the at least one of the composition of the organic material and the rate of the organic material ejected by the one or more nozzles is controlled by rotating a selector located next to the apparatus.

20. The method of claim 16, wherein the at least one of the composition of the organic material and the rate of the organic material ejected by the one or more nozzles is controlled by controlling the flow of carrier gas through the one or more source cells by the use of the first valve.

21. The method of claim 16, wherein the one or more nozzles comprise a low-emissivity material.

22. The method of claim 16, wherein each of the one or more source cells is no greater than about 10 cm from at least one of the one or more nozzles.

23. The method of claim 16, wherein the apparatus further comprises a single-piece structure containing the one or more source cells.

24. The method of claim 16, wherein the one or more nozzles are not greater than about 1 mm from the substrate.

25. The method of claim 16, further comprising:

depositing a plurality of layers on the substrate, each layer comprising the organic material contained in at least one of the one or more source cells.

26. The method of claim 25, wherein the plurality of layers are deposited during a single pass of the substrate relative to the apparatus.

27. The method of claim 26, further comprising:

for each deposited layer, directing the flow of carrier gas through a source cell containing the organic material for the layer.

28. The method of claim 25, wherein each of the plurality of layers is deposited in a separate pass of the substrate relative to the apparatus.

29. The method of claim 16, wherein the organic material is deposited in a layer having a lateral pattern.

30. The method of claim 29, wherein the layer comprises a plurality of physically-separate features.

31. The method of claim 29, wherein the layer comprises a plurality of pixels.

32. A method of depositing an organic material, comprising:

moving a substrate relative to an apparatus integrally connected to a nozzle, the apparatus comprising:

a plurality of source cells, each source cell containing an organic material;

a carrier gas inlet leading to each source cell;

a carrier gas outlet leading from each source cell to the one or more nozzles; and a first valve capable of controlling the flow of a carrier gas through each of the plurality of source cells; and controlling at least one of the composition of the organic material and the rate of the organic material ejected by the one or more nozzles while moving the substrate relative to the apparatus, such that an organic material is deposited over the substrate.

33. The method of claim 32, wherein the substrate is stationary and the apparatus is moved in a direction parallel to the plane of the substrate.

34. The method of claim 32, wherein the apparatus is stationary and the substrate is moved in a direction parallel to the plane of the substrate.

35. The method of claim 32, wherein the at least one of the composition of the organic material and the rate of the organic material ejected by the one or more nozzles is controlled by rotating the apparatus about an axis of the apparatus.

36. The method of claim 32, wherein the at least one of the composition of the organic material and the rate of the organic material ejected by the one or more nozzles is controlled by rotating a selector located next to the apparatus.

37. The method of claim 32, wherein the at least one of the composition of the organic material and the rate of the organic material ejected by the one or more nozzles is controlled by controlling the flow of carrier gas through at least one of the plurality of source cells by the use of the first valve.

38. The method of claim 32, wherein the one or more nozzles comprise a low-emissivity material.

39. The method of claim 32, wherein each of the plurality source cells is no greater than about 10 cm from at least one of the one or more nozzles.

40. The method of claim 32, wherein the apparatus further comprises a single-piece structure containing the plurality of source cells.

41. The method of claim 32, wherein the one or more nozzles are not greater than about 1 mm from the substrate.

42. The method of claim 32, further comprising:

depositing a plurality of layers on the substrate, each layer comprising the organic material contained in at least one of the plurality of source cells.

43. The method of claim 42, wherein the plurality of layers are deposited during a single pass of the substrate relative to the apparatus.

44. The method of claim 43, further comprising:

for each deposited layer, directing the flow of carrier gas through a source cell containing the organic material for the layer.

45. The method of claim 42, wherein each of the plurality of layers is deposited in a separate pass of the substrate relative to the apparatus.

46. The method of claim 32, wherein the organic material is deposited in a layer having a lateral pattern.

47. The method of claim 46, wherein the layer comprises a plurality of physically-separate features.

48. The method of claim 46, wherein the layer comprises a plurality of pixels.

* * * * *